United States Patent
Omernick et al.

(10) Patent No.: US 9,425,794 B1
(45) Date of Patent: Aug. 23, 2016

(54) TESTING SYSTEM FOR POWER DELIVERY NETWORK

(71) Applicant: Google Inc., Mountain View, CA (US)

(72) Inventors: Mark Omernick, San Francisco, CA (US); Gregory Sizikov, Cupertino, CA (US)

(73) Assignee: Google Inc., Mountain View, CA (US)

( * ) Notice: Subject to any disclaimer, the term of this patent is extended or adjusted under 35 U.S.C. 154(b) by 116 days.

(21) Appl. No.: 14/329,384

(22) Filed: Jul. 11, 2014

(51) Int. Cl.
*H03K 19/003* (2006.01)
*H03K 19/0175* (2006.01)

(52) U.S. Cl.
CPC .. *H03K 19/00369* (2013.01); *H03K 19/017581* (2013.01)

(58) Field of Classification Search
CPC ............ G01R 31/3004; G01R 31/31721; G01R 27/16; G01R 31/318519; G06F 11/267; G06F 11/2733; G06F 1/28; G06F 1/305; G06F 1/26; G06F 1/266; G11C 5/14; H02M 1/36; H02M 1/44; H02M 3/156; Y02B 90/226
See application file for complete search history.

(56) References Cited

U.S. PATENT DOCUMENTS

2007/0234245 A1* 10/2007 Nguyen et al. ............... 716/4

OTHER PUBLICATIONS

A. Waizman, et al. "Integrated Power Supply Frequency Domain Impedance Meter", IEEE 13th Topical Meeting on electrical Performance of Electronic Packaging, Oct. 2004, pp. 217-220.*
Waizman et al., "Integrated Power Supply Frequency Domain Impedance Meter (IFDIM)," Electrical Performance of Electronic Packaging, 2004. IEEE 13th Topical Meeting, pp. 217-220, 4 pages.
Zhou et al., "A method to measure impedance of chip/package/board power supply system using pseudo-impulse current," Electrical Performance of Electronic Packaging, 2006. IEEE pp. 33-36, 4 pages.

* cited by examiner

*Primary Examiner* — Alexander H Taningco
*Assistant Examiner* — Seokjin Kim
(74) *Attorney, Agent, or Firm* — Fish & Richardson P.C.

(57) ABSTRACT

Systems and apparatus for an integrated test tool for that utilizes reconfigurable hardware to assess power delivery quality. In one aspect, a method includes receiving, at a control logic block in a field programmable gate array (FPGA), a load current amplitude value and a load current frequency value; determining, by the control logic block, an activation modulation signal that causes each of a plurality of load cells to which it is applied to be in an active state for a first period of time and in an inactive state during a second period of time, and a first of number of load cells that when activated according to the activation modulation signal cause the FPGA to draw a load current at the load current amplitude.

14 Claims, 2 Drawing Sheets

TESTING SYSTEM FOR POWER DELIVERY NETWORK

BACKGROUND

Reconfigurable computing platforms are prevalent in industry, and among the most popular are Field Programmable Gate Arrays (FPGAs). FPGAs often require voltage regulators and power delivery networks that can provide low voltage at a high current. Furthermore, the power delivery network should be able to provide a reliable source of power over a range of load current frequencies and amplitudes.

The performance of FPGAs is, of course, dependent in part on the performance of the respective voltage regulator and power distribution network supplying the respective FPGA. There are, however, challenges in designing a power system for FPGAs and other such devices. For example, it is very difficult to reliably predict the maximum power consumption of an FPGA, as the vendors' estimates may often be inaccurate. Additionally, because FPGA register transfer level (RTL) payloads are changeable, it is unlikely that a full payload will be ready early in a project for power load testing.

SUMMARY

This specification relates to a testing system for a power delivery network and voltage regulators. In general, one innovative aspect of the subject matter described in this specification can be embodied in a method including the actions of receiving, at a control logic block in a field programmable gate array (FPGA), a load current amplitude value and a load current frequency value, determining, by the control logic block: an activation modulation signal defining a duty cycle that causes each of a plurality of load cells to which it is applied to be in an active state for a first period of time and in an inactive state during a second period of time, wherein each load cell is in the FPGA and is configured to perform a set of operations at first clock frequency value of a first clock, and a first of number of load cells that when activated according to the activation modulation signal cause the FPGA to draw a load current at the load current amplitude, selecting, by the control logic block, the first number of load cells in the FPGA, and providing, by the control logic block, the activation modulation signal to each selected load cells so that activation of each of the selected load cells is modulated according to the duty cycle of the modulation signal, resulting in the FPGA drawing a current at the load current amplitude value and at the load current frequency.

In general, another innovative aspect of the subject matter described in this specification can be embodied in a system including a testing host system in data communication with a field programmable gate array (FPGA), the testing host system programmed to provide load current amplitude values and load current frequency values to the FPGA, and to monitor supply voltage and supply current in a power distribution network that provides power to the FPGA and associate monitored supply voltage values and supply current values with the load current amplitude values and load current frequency values provided to the FPGA, and an FPGA including a control logic block and load cells, wherein the control logic block is configured to: determine an activation modulation signal defining a duty cycle that causes each of a plurality of load cells to which it is applied to be in an active state for a first period of time and in an inactive state during a second period of time, wherein each load cell is in the FPGA, and perform a set of operations at a first clock frequency value of a first clock, determine a first of number of load cells that when in activated according to the activation modulation signal cause the FPGA to draw a load current at the load current amplitude, select the first number of load cells in the FPGA, and provide the activation modulation signal to each selected load cells so that activation of each of the selected load cells is modulated according to the duty cycle of the modulation signal, resulting in the FPGA drawing a current at the load current amplitude value and at the load current frequency.

Particular embodiments of the subject matter described in this specification can be implemented so as to realize one or more of the following advantages. Accurate and efficient assessment of power delivery quality, and voltage regulators, can be obtained at various load current amplitudes and frequencies. Particular embodiments of the subject matter also allow for accurate measuring of environmental factors, such as temperature. Particular embodiments of the subject matter also allow for accurate determination of systems impedance profile, which can be used to attribute poor performance to a specific component of the respective system. Finally, the systems and methods enable full and complete testing of FPGA voltage regulators and power delivery in a manner that allows for the creation of a repeatable test profile, which facilitates debugging system power issues. In turn, this leads to early bug detection and allows for accurate margining and characterization. Particular embodiments of the subject matter provide a single feature that may be used to test an entire power system, without requiring a dedicated Design for Testability (DFT) in the FPGA.

The details of one or more embodiments of the subject matter described in this specification are set forth in the accompanying drawings and the description below. Other features, aspects and advantages of the subject matter will become apparent from the description, the drawings and the claims.

BRIEF DESCRIPTION OF THE DRAWINGS

Like reference numbers and designations in the various drawings indicate like elements.

DETAILED DESCRIPTION

The systems and methods described below facilitate configurable current consumption by an FPGA. By utilizing configurable parameters, the system can provide robust testing of a power system that delivers power to the FPGA.

In some implementations, there are two configurable parameters that can be set—load current amplitude and load current frequency. The load current amplitude can range from a leakage current value up to the maximum current value based on nearly complete utilization of FPGA resources. The load current frequency can be adjusted by a modulation signal. The signal may range from DC, constant current, to high modulation frequencies up to hundreds of MHz. The limit for high frequency is the core clock frequency of the FPGA.

By adjusting the load current amplitude and load current frequency values, the FPGA operation can be adjusted in a manner that provides in-depth testing of the power system that provides power to the FPGA.

These features and additional features are described in more detail below.

Figure 1:
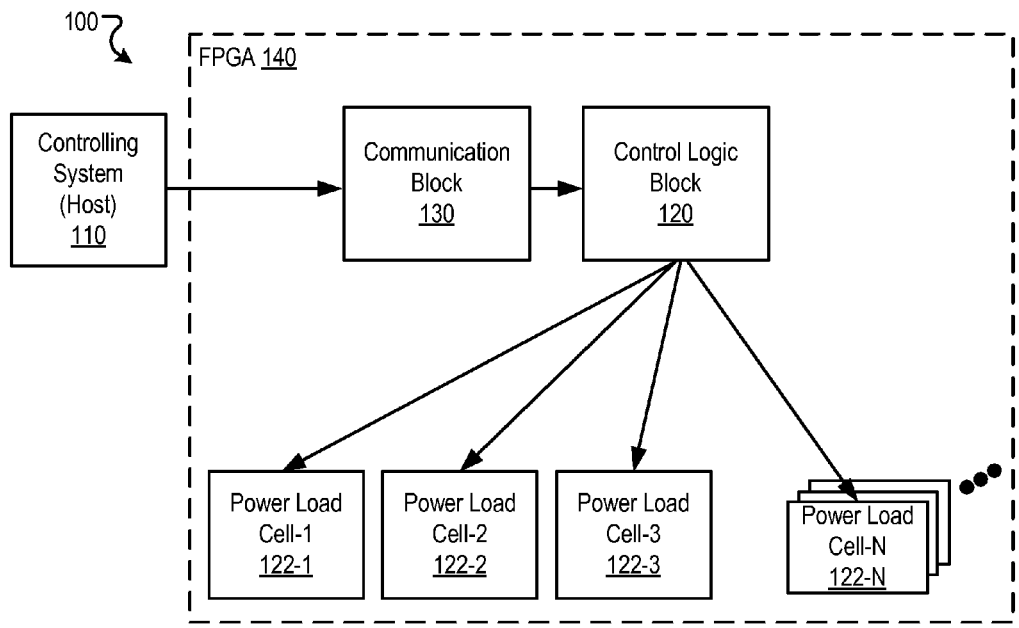
FIG. 1 is a block diagram of an example system for testing a power system.
Figure 2:
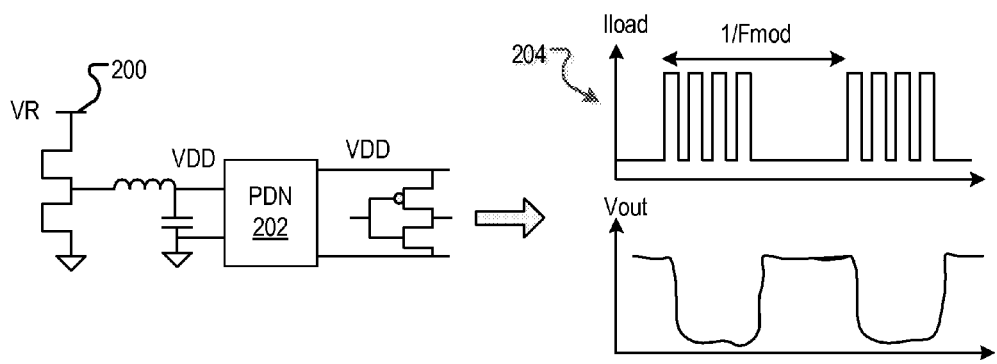
FIG. 2 is a block diagram illustrating a power distribution network being analyzed under load.

FIG. 1 is a block diagram of an example system 100 for testing a power system. The system 100 comprises a controlling system (Host 110) in communication with an FPGA 140. The FPGA is powered by a voltage regulator 200 and power delivery network 202, such as depicted in FIG. 2.

The FPGA 140 includes a communication block 130, control logic block 120, and power load cells 122. Each load cell 122 is configured to perform a set of operations at a first clock frequency value of a first clock. As will be described below, the load cells 122 are configured in a manner that maximizes the use of FPGA processing resources so that when all the load cells are active, the FPGA will be drawing a maximum load current. The actual operations performed by the load cells 122 can vary, and are merely selected so as to utilize FPGA resources.

Figure 3:
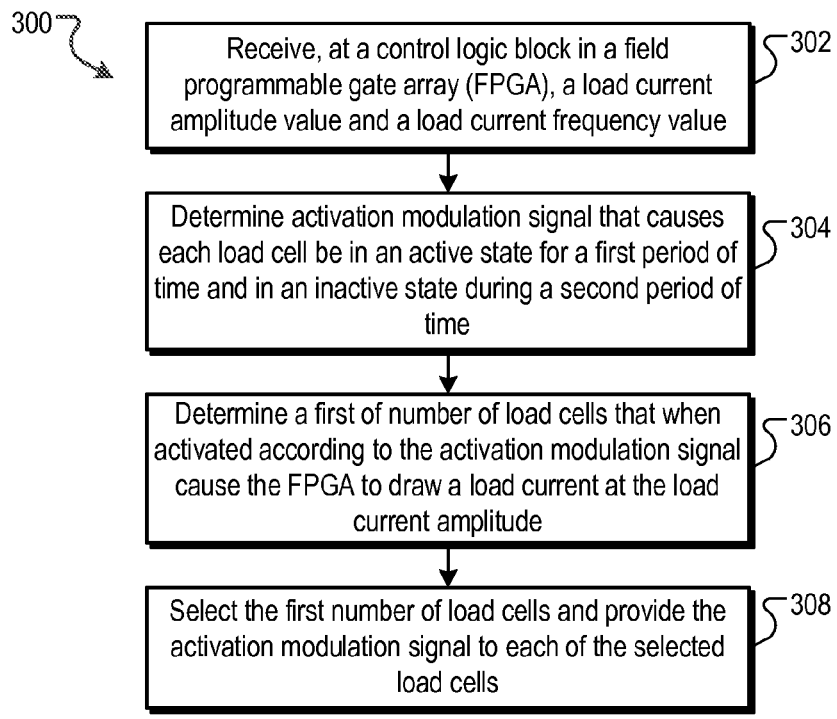
FIG. 3 is a flow chart of an example process for testing power delivery for an FPGA.

Operation of the system 100 is described with reference to FIG. 3, which is a flow diagram of an example process 300 for testing power delivery for an FPGA.

To test the power system 200 and the FPGA 140 at a particular current value and amplitude, an operator inputs the current value and frequency value into the controlling system 110. The controlling system 110, in turn, provides data indicating an amplitude value and a frequency value to the FPGA communication block 130. The communications can be facilitated by any appropriate protocol or process, such as PCIe, I2C, or even direct GPIO pin access. The communication block 130 receives and interprets the commands and, in turn, provides the amplitude value and the frequency value to the control logic block 130.

The control logic block 130, in some implementations, includes a counter, a clock gate, and a decoder. The clock gate is used to gate the core clock of the FPGA, which has a clock frequency at which the load cells 122 operate. In operation, the control logic block 130 receives the data specifying the load current amplitude and the load current frequency values (302). In response, the control logic block 130 determines an activation modulation signal that causes each load cell to be in an active state for a first period of time and in an inactive state during a second period of time (304).

In some implementations, the activation modulation signal defines a duty cycle. The duty cycle determines the load current frequency. For example, with reference to FIG. 2, for an input parameter of Fmod, a 50% duty cycle is generated. The duty cycle shown is an example, and duty cycles of other than 50% can also be used. In some implementations, the duty cycle is controlled by the clock gate. In other implementations, the duty cycle may be defined by respective number of on and off cycles of the core clock of the FPGA. For example, as shown in FIG. 2, a 50% duty cycle with four "On" cycles and four "Off" cycles is shown.

The number of on and off cycles is determinative of the load current frequency. In the example of FIG. 2, the load current frequency would be ⅛ the core clock frequency. More generally, the activation modulation signal can be determined by dividing the core clock frequency value by the load current frequency value to obtain a modulation count value. In the example of FIG. 2, the modulation count value is 8.

To determine the duty cycle, a first count value and a second count value that sum to the modulation count value are determined. The load cells 122 are activated for a number of clock cycles equal to the first count, and deactivated for a number of clock cycles equal to the second count. Thus, a variety of duty cycles and corresponding frequency modulations can be realized by adjusting the first and second count values.

Other appropriate ways of controlling the activation of load cells 122 can also be used. In some implementations, for example, the control logic block 130 may create a particular current pattern that is not specific to a particular duty cycle. For example, the control logic block 130 may activate the load cells for 5 clock cycles, deactivate the load cells for 10 clock cycles, activate the load cells for 15 clock cycles, and then deactivate the load cells for 20 cycles. Any current pattern can be produced by using the control logic block and the activation and deactivation of the load cells.

The control logic block 120 also determines a first of number of load cells 122 that when activated according to the activation modulation signal cause the FPGA 140 to draw a load current at the load current amplitude. For example, if the tester desires to test the power system 200 at a maximum load current, then all of the load cells 122 would be selected. Conversely, if the amplitude of the load current is less than the maximum amount, fewer than all the load cells will be selected.

The current amplitude can be specified, for example, using an RMS value, or a peak value. The measurement type can be selected by the user.

The amount of current each load cell 122 draws is determined by the size of the load cell and can be measured empirically. Generally, more load cells on the FPGA 140 will result in a much finer current amplitude control than available for fewer load cells. However, the more load cells that are configured, the more resources that will be required for the control logic block 120. This, in turn, means that maximum load current amplitude available for a FPGA 140 with very fine amplitude control will be less than the maximum load current amplitude for an FPGA 140 with coarser amplitude control. The tester will typically consider these parameters when initiating a test.

In some implementations, the power load cells 120 are of equal size, which simplifies the control logic. In other implementations the power load cells can be of different sizes. For example, one load cell 122 may consume half the processing resource of the FPGA 140, while the remaining may each consume only 1% each. This results in very fine load current amplitude control for a large current, but over a smaller range of amplitude control than would be available if all load cells consume only 1% of the FPGA resources.

The operations performed by the load cells 122 depend on the FPGA used. For example, for an FPGA that consists of storage elements (e.g., flip-flops (FFs)) and look up elements (e.g., LUTs), various strings of registers can be configured. One type of string may contain directly connected flip-flops, and a second type of string may contain interstitial logic of flip-flops connected to inverters that are connected to flip-flops. The length of the strings is selected in proportion to the number of LUTs and FFs in the FPGA, and the number of desired load cells 122. The absolute length of these strings is dependent on the routing resources available in the FPGA.

The load cells 122 may also contain manufacturer-specific design blocks, such as DSPs or block RAMs, which are connected to flip-flop strings in order to generate data inputs. The ratio of these design blocks to flops is selected to optimally balance utilization and routing resources in the load cells.

After the activation modulation signal and the first number of load cells are determined, the control logic block 120 selects the first number of load cells and provides the activation modulation signal to each of the selected load cells (308). This results in the activation of each of the selected load cells according to the duty cycle of the modulation signal. The collective operation of the load cells 122, where each load cell contributes to the current draw, results in the FPGA drawing a current at the load current amplitude value and at the load current frequency value.

Once the control logic block 120 gates the core clock and activates the appropriate number of power load cells, voltage and current measurements are obtained for the system 200. The impedance may be determined based on the voltage and current measurements. In some implementations the measurements may also include environmental measurements such as temperature.

Figure 4:
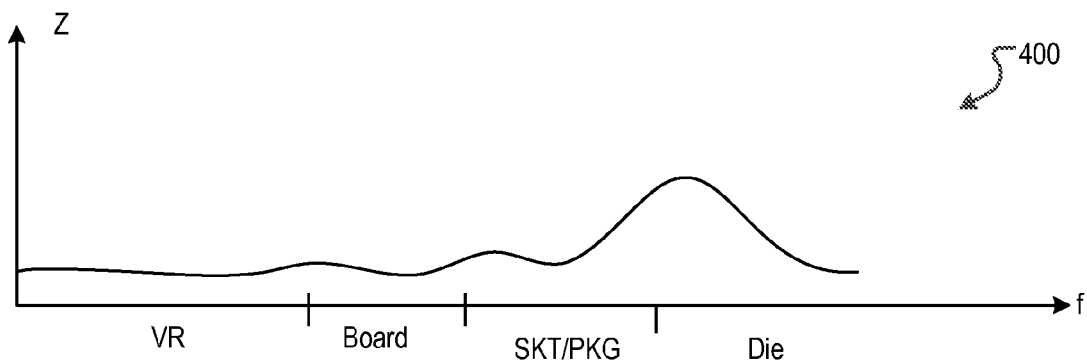
FIG. 4 is an illustration of an impedance profile obtained using the system of FIG. 1.

Generally, to determine the impedance of a system, voltage measurements at the system are divided by current measurements at the system. The impedance profile of a system provides impedance values of the system at different frequencies. To determine the impedance profile, the control system 100 may iteratively change the frequency and amplitude to determine measurements along a frequency spectrum. For example, an impedance distribution, such as the impedance profile of FIG. 4, may be determined by iteratively determining impedances at different frequencies at a maximum load. The impedance profile may be further used to determine the performance of different components of the system, as indicated by the frequency regions. Generally, a deviation from the flat distribution indicates a possible problem in the overall system. For example, the profile of FIG. 4 indicates that there may be a performance issue at for the given load current amplitude at higher frequency, which may indicate a problem with either the package or the die.

The impedance profile defines the response of the FPGA power delivery and voltage regulator system to dynamic load current changes. In some implementations, a step response of the system may be determined based on the rate of change or the time derivative of the load current. The step response provides the time evolution of the output of a system in response to a step function input to the system. The step response is generally used to characterize systems. Other types of response may be obtained similarly, for example, by adjusting the current patterns.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed to achieve desirable results. Moreover, the separation of various system components in the embodiments described above should not be understood as requiring such separation in all embodiments, and it should be understood that the described components and systems can generally be integrated together in a single product.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. A method, comprising:
   iteratively receiving, at a control logic block in a field programmable gate array (FPGA), load current amplitude values and a load current frequency values, wherein for each iteration a particular load current amplitude value and a particular load current frequency value is received, and wherein at least two different load current amplitude values are received;
   for each iteration:
      determining, by the control logic block based on the load current amplitude value received and the load current frequency value received for the iteration:
         an activation modulation signal that causes each of a plurality of load cells to which it is applied to be in an active state for a first period of time and in an inactive state during a second period of time, wherein each load cell is in the FPGA and is configured to perform a set of operations at first clock frequency value of a first clock; and
         a first of number of load cells that when activated according to the activation modulation signal cause the FPGA to draw a load current at an amplitude that is specified by the load current amplitude value;
      selecting, by the control logic block, the first number of load cells in the FPGA; and
      providing, by the control logic block, the activation modulation signal to each selected load cells so that activation of each of the selected load cells is modulated according to the activation modulation signal, resulting in the FPGA drawing the load current at the load current amplitude value and at a frequency that is specified by the load current frequency value.

2. The method of claim 1, wherein the activation modulation signal defines a duty cycle.

3. The method of claim 2, wherein the load current frequency value is less than the first clock frequency value.

4. The method of claim 3, wherein determining the activation modulation signal comprises:
   dividing the first clock frequency value by the load current frequency value to obtain a modulation count value;
   determining a first count value and a second count value that sum to the modulation count value; and
   causing the selected load cells to be active for a number of first clock cycles equal to the first count value; and
   causing the selected load cells to be inactive for a number of first clock cycles equal to the second count value.

5. The method of claim 4, wherein the first count and the second count are equal.

6. The method of claim 1, wherein the load current amplitude value is a peak amplitude value.

7. The method of claim 1, further comprising monitoring supply voltage and supply current in a power distribution network that provides power to the FPGA.

8. The method of claim 1, further comprising monitoring the supply voltage and supply current in the power distribution network that provides power to the FPGA for a plurality of load current frequency values at the load current amplitude.

9. A system, comprising:
   a testing host system in data communication with a field programmable gate array (FPGA), the testing host system programmed to provide load current amplitude values and load current frequency values to the FPGA, and to monitor supply voltage and supply current in a power distribution network that provides power to the FPGA and associate monitored supply voltage values and supply current values with the load current amplitude values and load current frequency values provided to the FPGA; and
   an FPGA including a control logic block and load cells, wherein:
      the control logic block is configured to:
         iteratively receive load current amplitude values and a load current frequency values, wherein for each iteration a particular load current amplitude value and a particular load current frequency value is received, and wherein at least two different load current amplitude values are received;
         for each iteration, determine, based on the load current amplitude value received and the load current frequency value received for the iteration:
            an activation modulation signal that causes each of a plurality of load cells to which it is applied to be in an active state for a first period of time and in an inactive state during a second period of time, wherein each load cell is in the FPGA and is configured to perform a set of operations at a first clock frequency value of a first clock;
            a first of number of load cells that when in activated according to the activation modulation signal cause the FPGA to draw a load current at an amplitude that is specified by the load current amplitude value;
         select the first number of load cells in the FPGA; and
         provide the activation modulation signal to each selected load cells so that activation of each of the selected load cells is modulated according to the activation modulation signal, resulting in the FPGA drawing the load current at the load current amplitude value and at a frequency that is specified by the load current frequency value.

10. The system of claim 9, wherein the activation modulation signal defines a duty cycle.

11. The system of claim 10, wherein the load current frequency value is less than the first clock frequency value.

12. The system of claim 11, wherein determining the activation modulation signal comprises:
   dividing the first clock frequency value by the load current frequency value to obtain a modulation count value;
   determining a first count value and a second count value that sum to the modulation count value; and
   causing the selected load cells to be active for a number of first clock cycles equal to the first count value; and
   causing the selected load cells to be inactive for a number of first clock cycles equal to the second count value.

13. The system of claim 12, wherein the first count and the second count are equal.

14. The system of claim 10, wherein the load current amplitude value is a peak amplitude value.

* * * * *